(12) United States Patent
Accardi et al.

(10) Patent No.: US 8,575,005 B2
(45) Date of Patent: Nov. 5, 2013

(54) METHOD OF MANUFACTURING AN ELECTRONIC DEVICE HAVING A PLASTIC SUBSTRATE AND CORRESPONDING CARRIER

(75) Inventors: Corrado Accardi, Ragusa (IT); Stella Loverso, Catania (IT); Sebastiano Ravesi, Catania (IT); Noemi Graziana Sparta, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/559,433

(22) Filed: Jul. 26, 2012

(65) Prior Publication Data
US 2013/0029486 A1 Jan. 31, 2013

(30) Foreign Application Priority Data
Jul. 27, 2011 (IT) .............................. MI2011A1405

(51) Int. Cl.
H01L 21/02 (2006.01)
H01L 21/30 (2006.01)
H01L 21/46 (2006.01)

(52) U.S. Cl.
USPC ............ 438/458; 257/E21.088; 257/E21.122; 257/E21.48; 257/E21.519; 257/E21.567; 438/455; 438/654

(58) Field of Classification Search
USPC ..................... 257/E21.088, E21.122, E21.48, 257/E21.519, E21.567; 438/455, 458, 654
See application file for complete search history.

(56) References Cited

U.S. PATENT DOCUMENTS

| | | | |
|---|---|---|---|
| 5,151,388 A * | 9/1992 | Bakhit et al. | ..................... 29/593 |
| 5,972,152 A | 10/1999 | Lake et al. | |
| 7,466,390 B2 | 12/2008 | French et al. | |
| 8,455,872 B2 | 6/2013 | French | |
| 2005/0221598 A1 | 10/2005 | Lu et al. | |
| 2007/0010067 A1 | 1/2007 | Shimoda et al. | |
| 2008/0113486 A1 | 5/2008 | Eguchi et al. | |
| 2009/0020592 A1 | 1/2009 | Lee et al. | |
| 2009/0022901 A1 | 1/2009 | Ray et al. | |
| 2009/0305467 A1 | 12/2009 | Goto et al. | |
| 2009/0314527 A1 | 12/2009 | Hatano et al. | |
| 2010/0163878 A1 | 7/2010 | Haskal et al. | |

OTHER PUBLICATIONS

Bock, K. et al., "Characterization of electrostatic carrier substrates to be used as a support for thin semiconductor wafers," CS MANTECH, 20th International Conference on Compound Semiconductor Manufacturing Technology 2005, New Orleans, LA, Apr. 11-14, 2005, 4 pgs.

(Continued)

*Primary Examiner* — Asok K Sarkar
(74) *Attorney, Agent, or Firm* — Seed IP Law Group PLLC

(57) ABSTRACT

A method of manufacturing an electronic device on a plastic substrate includes: providing a carrier as a rigid support for the electronic device; providing a metallic layer on the carrier; forming the plastic substrate on the metallic layer, the metallic layer guaranteeing a temporary bonding of the plastic substrate to the carrier; forming the electronic device on the plastic substrate; and releasing the carrier from the plastic substrate. Releasing the carrier comprises immersing the electronic device bonded to the carrier in a oxygenated water solution that breaks the bonds between the plastic substrate and the metallic layer.

20 Claims, 5 Drawing Sheets

(56) References Cited

OTHER PUBLICATIONS

Wikipedia article entitled "EPLaR," Electronics on Plastic by Laser Release, by Philips Research. Retrieved from http://en.wikipedia.org/w/index.php?title=EPLaR&oldid=466296252, Dec. 17, 2011.

Landesberger, C. et al., "Carrier techniques for thin wafer processing," CS MANTECH Conference, Austin, TX, pp. 33-36, May 14-17, 2007.

Landesberger, C., "Electrostatic Carrier Technique for Thin Wafer Processing," Future Fab Intl., Issue 29, Apr. 29, 2009, 8 pgs.

MacCarthy, N. et al., "A laser release method for producing prototype flexible retinal implant devices," Sensors and Actuators A(132):296-301, 2006.

Metz, S. et al., "Partial Release and Detachment of Microfabricated Metal and Polymer Structures by Anodic Metal Dissolution," Journal of Microelectromechanical Systems 14(2):383-391, Apr. 2005.

REVALPHA™ Thermal Release Tape, Nitto Denko Corporation, product information retrieved from http://www.nitto.com/product/datasheet/e_parts/010/, 2013.

REXPAN® adhesive tape, Haeun Chemtec, product information retrieved from http://www.haeun-ct.com/main/?skin=e_prod_04.html, 2013.

Smith, A. et al., "A Chemical and Thermal Resistant Wafer Bonding Adhesive Simplifying Wafer Backside Processing," CS MANTECH Conference, Vancouver, B.C., pp. 269-271, Apr. 24-27, 2006.

Xiao, S. Y. et al., "A novel fabrication process of MEMS devices on polyimide flexible substrates," Microelectronic Engineering, vol. 85, pp. 452-457, 2008.

\* cited by examiner

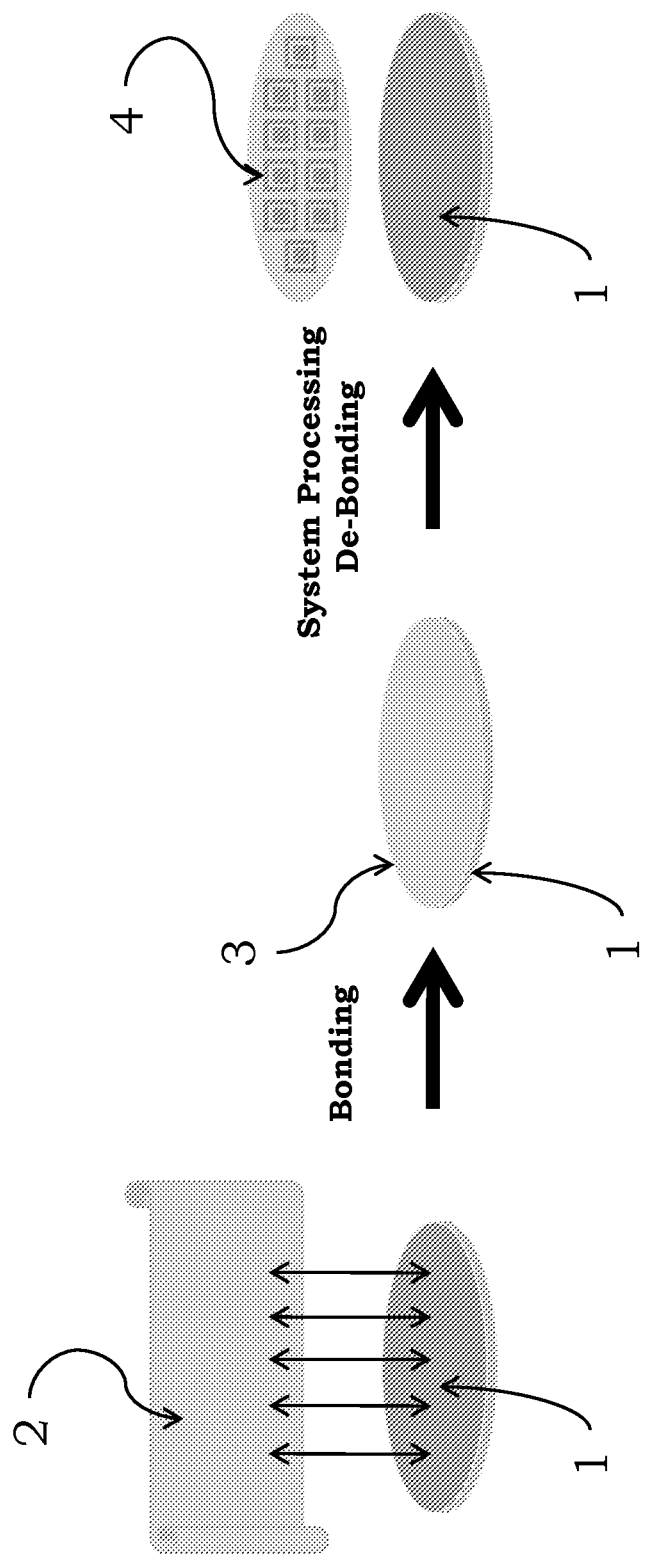

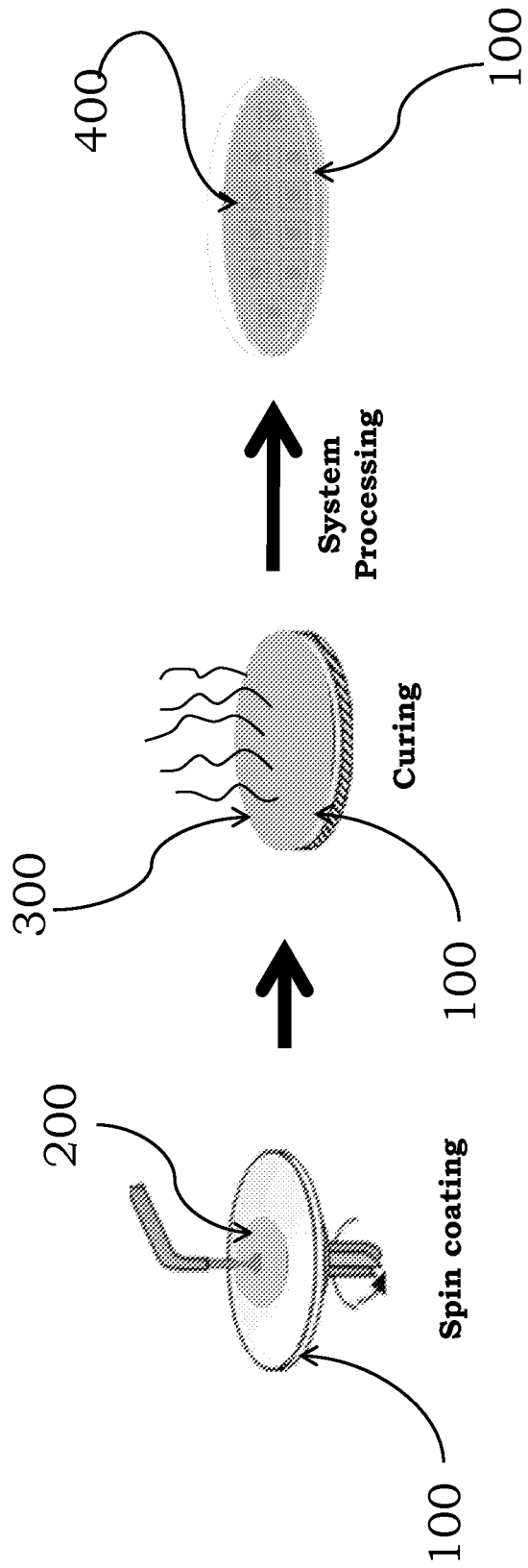

METHOD OF MANUFACTURING AN ELECTRONIC DEVICE HAVING A PLASTIC SUBSTRATE AND CORRESPONDING CARRIER

BACKGROUND

1. Technical Field

The present disclosure relates to a method of manufacturing an electronic device realized on plastic substrates, such as active matrix display devices or photovoltaic panels or sensors network.

The disclosure refers, in particular, but not exclusively, to a method of manufacturing an electronic device comprising a plastic substrate fixed to a rigid carrier, and the following description is made with reference to this field of application just for explanation convenience.

2. Description of the Related Art

Recently, interest in plastic devices for displays, photovoltaic panels and sensor networks has increased even further, due to the low cost, light weight, flexibility, and resistance to breaking of such devices. Despite this interest, there is still a need for a plausible manufacturing route for mass production of this kind of devices.

A number of different ways have been reported for the manufacturing of electronic devices on plastic substrates; however, all these manufacturing ways have some drawbacks mainly due to:

the difficulty of setting-up processes compatible with plastics such as by using low temperatures and non-aggressive chemicals;

managing of flexible, light and sometimes transparent devices using conventional equipments generally suitable for processing rigid substrates.

It is well known that a possibility for manufacturing flexible devices using conventional equipment is to process a plastic substrate fixed over a rigid carrier substrate. The rigid carrier substrate is then released from the plastic substrate after having formed the circuit layouts over the plastic substrate. This enables to employ substantially conventional substrate handling and cell making processes. This known technique is called "temporary bonding" because it involves fixing the plastic substrate on the rigid substrate, also called the carrier, for a limited time period and in removing the plastic substrate from the carrier at the end of the manufacturing process.

As an example, FIGS. 1A-1C show the steps of a manufacturing process of an electronic device having a plastic substrate, according to the prior art. In particular, FIG. 1A shows a rigid carrier 1 and a plastic foil 2 that can be cut, modeled and bonded on the carrier 1, thus covering it as a plastic substrate 3 as shown in FIG. 1B. FIG. 1C shows an electronic device 4 manufactured on the plastic substrate 3 and released from the carrier 1.

Several methods are used to release the carrier from the plastic substrate at the end of the manufacturing process, depending on the plastic materials being used. In particular, a first type of plastic materials, such as polyethylene naphthalate (PEN), polyethylene terephthalate (PET), Arilite, Kapton, etc., can be laminated on the carrier. A second type of plastic materials can be obtained from liquid precursors, such as polyimide, silicon pastes, etc., which are deposited on the carrier, as they are or covered by either a metal or oxide or nitride layer, and then cured at high temperatures.

For the first type of plastic materials, a first known manufacturing process involves the steps of:

laminating a double-sided tape on the carrier; laminating the plastic materials on the double-sided tape;

realizing the electronic device on the plastic material;

releasing the carrier from the plastic substrate by putting it over a hot plate to increase its temperature.

Even if the double-sided tapes are very resistant to chemical agents being used in manufacturing processes and even if they do not release any impurity both on the plastic substrate and on the carrier, allowing the re-use of the carrier, they are however not very resistant to temperatures greater than 150° C., whereat an anticipated de-bonding of the carrier occurs.

A second known manufacturing process involves the steps of:

depositing a liquid glue on the carrier;

laminating the plastic materials on the carrier;

realizing the electronic device on the plastic material;

releasing the carrier by mechanically peeling the plastic substrate or chemically removing the glue.

Although the glue is more resistant to high temperatures, up to 200° C., it could be easily damaged by the chemical substances used in device manufacturing processes. Moreover, the de-bonding may cause damaging of the electronic device already formed, either in case of a mechanical de-bonding or a chemical attack.

A third known manufacturing process involves the steps of:

providing an electrostatic carrier comprising a pair of electrodes on which a dielectric material is deposited;

providing a plastic substrate adhering to the carrier due to the electrostatic field formed on it by an external power supply;

realizing the electronic device on the plastic material;

moving the device away from the carrier.

The advantage of this technique is to avoid the surface contamination caused by glue or by adhesive tapes, so that the carrier can be re-used for producing standard devices in semiconductor industries. Nevertheless, the electrostatic field exponentially decreases with time and is very sensitive to thermal processes, causing the anticipated de-bonding of the carrier.

For the second type of plastic materials, a first known manufacturing process involves the steps of:

providing a carrier with a superficial sacrificial layer;

spinning a liquid precursor on the carrier, in such a way to adhere to the sacrificial layer;

curing the precursor to form a thin film;

realizing the electronic device on the thin film;

removing the carrier by a wet etch or of an anodic dissolution.

The biggest problem of this type of de-bonding is that the carrier cannot be re-used. Moreover, in case of wet etch, the diffusion velocity of the removing solution is very limited, so that, for devices having an area of $cm^2$, the duration period of the wet etch could cause damaging of the devices. This is way the wet etch is more applicable for small devices and for carriers having a big area exposed to the removing solution. Similarly, the de-bonding by anodic dissolution involves a more rapid corrosion of the metals of the carrier exposed to the anodic solution as much as greater is the area of the exposed metals. In addition, this type of de-bonding cannot be used if the plastic substrate covers completely the sacrificial layer and it requests the use of a dedicated equipment to control the parameters of the dissolution process.

There is another known manufacturing process, specifically used for liquid photosensitive precursors, such as polyimide, and for transparent carriers involving the steps of:

spinning a liquid precursor on the carrier;

curing the precursor to form a thin film;

realizing the electronic device on the thin film;

de-bonding the carrier by exposing the thin film to a laser having a specific wavelength, such as 308 nm (Xe—Cl) or 193 nm (ArF excimer laser), in such a way to ablate a sub-micrometric layer of the thin film which remains bonded to the carrier and to have the device on the plastic substrate de-bonded.

For example, this last technique is described in the International patent application published under No. WO 05/050754 on Jun. 2, 2005 in the name of Koninklijke Philips Electronics, in which a substrate arrangement is manufactured by comprising a rigid carrier substrate, like glass, and a plastic substrate over the rigid carrier substrate. To release the plastic substrate from a glass carrier a heating method is used. By heating the glass and the plastic substrate, the plastic substrate and the electronic components formed on the substrate are released from the glass carrier. The release process, also called Electronics on Plastic by Laser Release (EPLaR) as proposed is a laser lift-off process. Laser light at ultraviolet wavelengths is used to cause the lift-off of the plastic substrate from the underlying carrier. It has been also indicated that the release process may be a photo-ablation process due to multiple-photon processes, including localized heating. A suggested material for this process is polyimide, which is chosen for its high-temperature stability and high absorption of UV energy.

The FIGS. 2A-2C show the steps of a manufacturing method comprising a step of releasing the carrier based on the laser ablation technique. More in details, as shown in FIG. 2A, a transparent carrier 10, like quartz, is provided and a liquid plastic precursor 20, such as polyimide, is spun on the carrier 10; the plastic precursor 20 is then cured to form a plastic substrate 30 bonded to the carrier 10. The carrier 10 with the plastic substrate 30 fixed to it is showed in FIG. 2B. At the end, an electronic device 40 is realized over the plastic substrate 30 and then released from the carrier 10 exposing it to a laser light at ultraviolet wavelengths to cause the lift-off.

There are some problems in using a heating effect to lift-off a plastic substrate from the glass. Sufficient energy is needed to enable lift off to occur, but without damaging either the plastic substrate or the components formed, damages occurring for the thermal expansion effects. When using a laser lift-off process, higher wavelengths within the UV spectrum are preferable because lower wavelengths are more absorbed by the glass substrate, making the laser release less effective. For example commercially available lasers which operate at 308 nm or 351 nm are preferred. At these high wavelengths, the energy absorbed in the plastic layer is statistically distributed without complete thermalization in the plastic polymer molecules. This gives rise to localized heating effects, which can in turn result in damages to the plastic substrate or the components mounted on it. This can also results in partial or poor lift-off from the carrier.

Moreover, the transparent carrier substrates, such as quartz, are very expensive.

BRIEF SUMMARY

One embodiment of the present disclosure is method of manufacturing an electronic device on a plastic substrate having structural and functional characteristics allowing to overcome the limits which still affect the methods previously disclosed with reference to the prior art.

One embodiment of the present disclosure is method of manufacturing an electronic device providing a special carrier for supporting a plastic substrate whereon is realized the electronic device, such a carrier being provided with a metallic layer in contact with the plastic substrate, the metallic layer being able to guarantee a temporarily bonding of the plastic substrate on the carrier. The method includes releasing the electronic device by breaking bonds between the plastic substrate and the metallic layer using oxygenated water.

More in particular, the metallic layer may be a double layer in the case of carriers that need an adhesion layer between the carrier itself and the metallic layer on which the plastic substrate is supported.

One embodiment is a method of manufacturing an electronic device having a plastic substrate, the method comprising the steps of:

providing a carrier as a rigid support for the electronic device;

providing at least a metallic layer on the carrier to guarantee a temporarily bonding of the plastic substrate on the carrier;

providing a plastic substrate on the metallic layer;

forming an electronic device over the plastic substrate;

releasing the carrier from the plastic substrate;

the step of releasing the carrier comprising breaking the bonds between the plastic substrate and the metallic layer using an oxygenated water solution.

More in particular, the disclosure comprises the following supplemental and optional features, taken alone or in combination when needed.

According to an aspect of the disclosure, the oxygenated water solution may be formed using hydrogen peroxide ($H_2O_2$).

The gaseous oxygen in the solution may be in the range of 10-50%, and preferably at 30%.

According to another aspect of the disclosure, the step of providing the carrier may comprise the steps of:

providing a substrate;

depositing the at least a metallic layer on the substrate.

Moreover, the step of forming a plastic substrate on the metallic layer may comprise the steps of:

spin coating a liquid plastic precursor on the metallic layer;

curing the plastic precursor forming the plastic substrate.

According to a further aspect of the disclosure, the oxygenated water solution may be at room temperature.

According to yet another aspect of the disclosure, the step of releasing the carrier may be few minutes long for a wafer of 15.24 cm (6") immerged in 100 ml of solution.

Releasing the carrier may comprise forming a protective tape on the electronic device.

According to an aspect of the disclosure, providing the substrate may comprise providing a wafer or a die. Moreover, providing the substrate may comprise providing a layer made by silicon or glass.

According to another aspect of the disclosure, providing the metallic layer may comprise providing a layer made of Platinum (Pt) or Palladium (Pd).

Moreover, step of providing the metallic layer may comprise providing a double layer comprising an adhesion promoter including: titanium (Ti), titanium nitrate (TiN). The thickness of the metallic layer may be in the range of 50-150 nm.

The characteristics and advantages of the manufacturing method according to the present disclosure will be apparent from the following description of an embodiment thereof given by way of indicative and non-limiting example with reference to the annexed drawings.

BRIEF DESCRIPTION OF THE SEVERAL VIEWS OF THE DRAWINGS

In such drawings:

FIGS. 1A-1C schematically show the steps of a manufacturing process of an electronic device having a plastic substrate, according to the prior art;

FIGS. 4A-4C schematically show the steps of a manufacturing process of an electronic device having a plastic substrate on a carrier, being realized according to the disclosure.

DETAILED DESCRIPTION

Figures 2A, 2B, 2C:
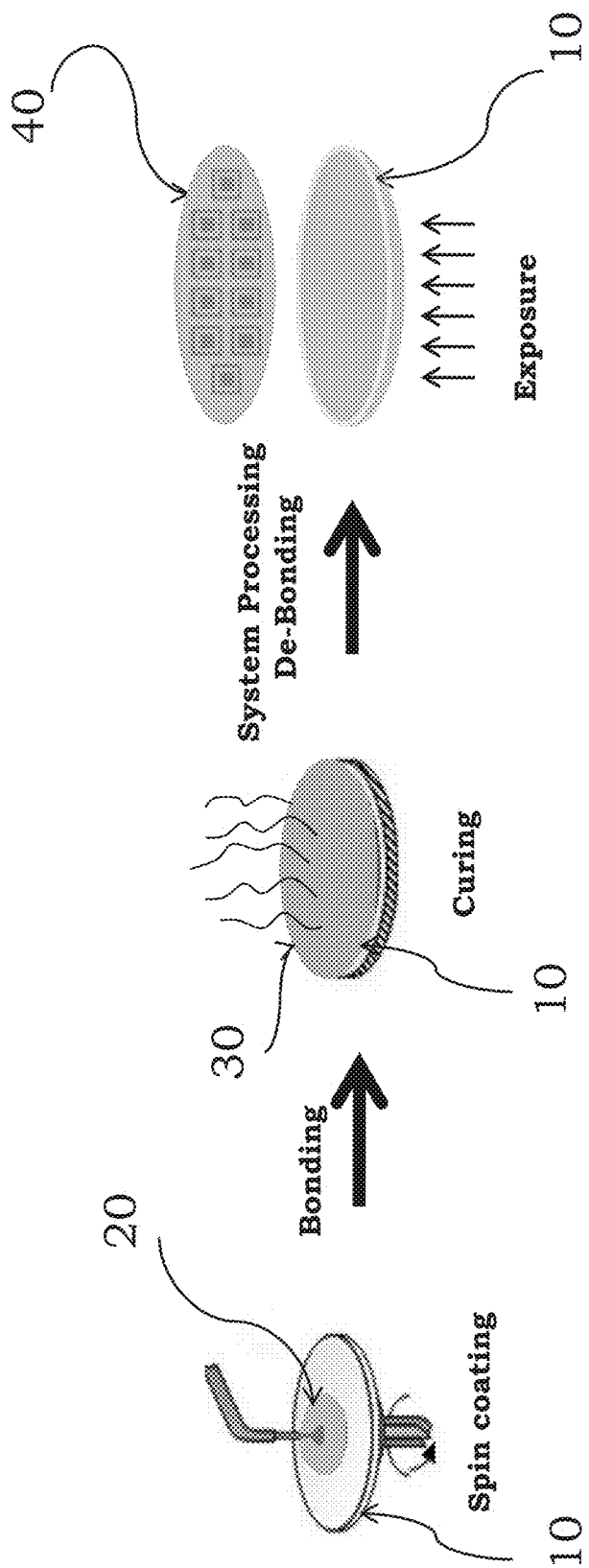
FIGS. 2A-2C schematically show the steps of a manufacturing process of an electronic device having a plastic substrate comprising a step of releasing the carrier based on laser ablation, according to the prior art.
Figure 3:
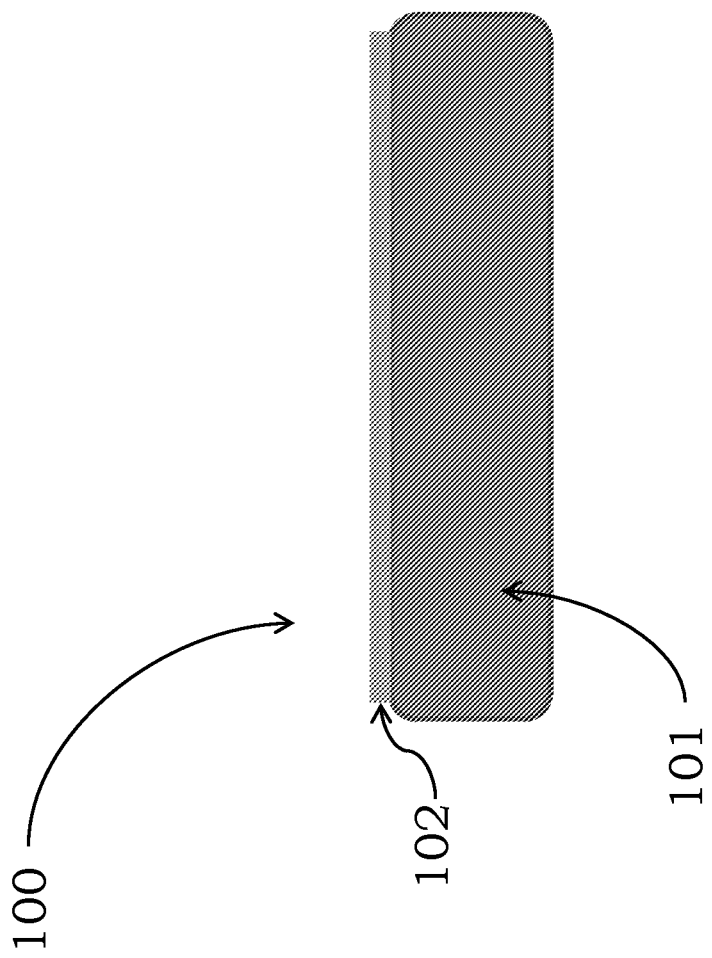
FIG. 3 schematically shows a cross section of a carrier, being realized according to the disclosure.

With reference to such figures, and in particular to FIG. 3, a carrier 100 is shown acting as a rigid support for an electronic device having a plastic substrate.

In particular, the carrier 100 comprises a rigid substrate 101, and a metallic layer 102.

The substrate 101 may be a silicon wafer or any other alternative wafer structure normally used in the microelectronic field. The metallic layer 102 may be a double layer comprising a further metallic layer acting as an adhesion promoter between the carrier and the metallic layer itself.

According to another aspect of the disclosure, the substrate 101 may be a die.

Moreover, the substrate 101 may be either a silicon substrate or a glass substrate or another material having features, such as shape, weight and dimensions, similar to silicon or glass.

The metallic layer 102 is deposited on the substrate 101 to guarantee a temporarily bonding of the substrate, in particular a plastic substrate, on the carrier 100.

According to an aspect of the disclosure, the metallic layer 102 is a Platinum (Pt) layer.

According to another aspect of the disclosure, the metallic layer 102 is a Palladium (Pd) layer.

When a double metallic layer is used, every kind of material having properties of good adhesion to the substrate 101 can be used as a further layer of the double metallic layer 102, in particular comprising an adhesion promoter including: Ti, TiN.

Every kind of material having the same properties of temporarily bonding a plastic substrate on the carrier 100 can be used as metallic layer 102.

The thickness of the metallic layer 102 is in the range of 50-200 nm in order to allow saving the cost of the carrier and to re-use it for future processes, as will be clear in the following.

FIG. 4A shows the rigid carrier 100 covered by a liquid plastic precursor 200, such as polyimide, and subjected to a spread out diffusion by a spin coating phase.

After that, the polyimide is cured to form a plastic substrate 300 which is bonded to the rigid carrier 100, as shown in FIG. 4B. The plastic substrate 300 is then subjected to standard process steps that manufacture electronic devices 400, as shown in FIG. 4C, having the plastic substrate 300 fixed to the rigid carrier 100.

Figures 5A, 5B, 5C:
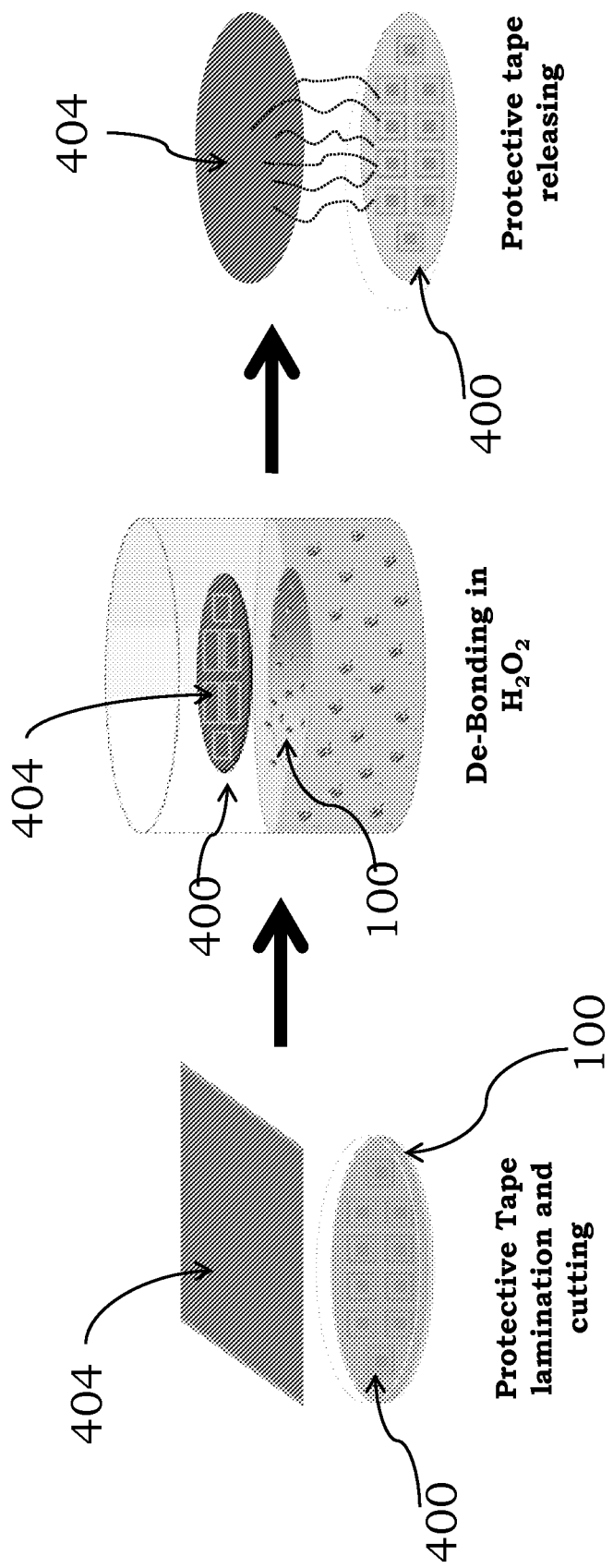
FIGS. 5A-5C schematically show the steps of the manufacturing process of an electronic device having a plastic substrate comprising a de-bonding of the carrier, being realized according to the disclosure.

FIG. 5A shows an electronic device 400 covered by a protective thermal releasable tape 404, simultaneously protecting the device from damages and from rolling up. The electronic device 400 covered with the protective tape 404 is then released by the rigid substrate 100 thanks to a removal phase breaking the bonds between the plastic substrate 300 and the metallic layer 102. For instance, the whole electronic device 400 may be immersed in a hydrogen peroxide ($H_2O_2$) 30% solution at room temperature, as shown in FIG. 5B, to allow the breaking of said bonds and thus the de-bonding of the electronic device 400 from the rigid carrier 100.

FIG. 5C shows a schematic view of the electronic device 400 separated both from the carrier 100 and also from the protective tape 404.

As already explained, the present application also relates to a method for manufacturing an electronic device 400 having a plastic substrate 300, the method comprising the steps of:
- providing a carrier 100 able to act as a rigid support for the electronic device 400;
- spin coating the carrier 100 with a liquid plastic precursor 200;
- curing the plastic precursor 200, obtaining a plastic substrate 300;
- cleaning the surface of the plastic substrate 300;
- fabricating the desired electronic device;
- depositing a protective tape 404 over the electronic device 400; and
- releasing the plastic substrate 300 from the carrier 100 by immersing the electronic device 400 covered with the protective tape 404 in a solution able to produce the separation of the carrier 100; for instance an oxygenated water solution.

As a skilled person in the art may appreciate, not all the above phases are strictly necessary for obtaining the final result of the electronic device 400 free from the carrier 100.

One of the most important aspects of the present disclosure is the possibility offered by the presence of the metal layer 102 on the carrier 100 to act as a temporary bonding of the plastic substrate 300. For instance the spin coating phase may be missing if a plastic substrate should be already available for a bonding of the metal layer 102.

The manufacturing method further advantageously comprises the steps of:
- providing the carrier 100 comprising a rigid substrate 101 and a metallic layer 102; and
- realizing the protective tape 404 for the electronic device 400 by means of a thermal process.

Advantageously, according to an aspect of the disclosure, the oxygenated water solution is a hydrogen peroxide ($H_2O_2$) 30% solution at room temperature.

Advantageously, according to another aspect of the disclosure, the oxygenated water solution is a solution of hydrogen peroxide ($H_2O_2$) in percentage comprised in the range of 10-50%, and preferably at 30%.

More in details, the electronic device 400 immersed in the described solution, is subject, due to the catalyst activity of the metallic layer 102, to the $H_2O_2$ dismutation reaction:

$$2H_2O_2 \rightarrow 2H_2O + O_{2g}$$

The gaseous oxygen ($O_{2g}$) obtained from the reaction is able to break the bonds between the polyimide of the plastic substrate 200 and the platinum of the metallic layer 102.

The separation is very fast, in the order of few minutes (1-5 min) for a wafer of 15.24 cm (6") immerged in 100 ml of solution.

The advantages that described carrier for an electronic device having a plastic substrate and of the corresponding manufacturing method of the electronic device having plastic substrate emerge clearly from the foregoing discussion.

In particular, no need is felt of having specific equipments, such as laser sources, to realize the releasing of the carrier from the electronic device having a plastic substrate.

In addition, it is possible to simultaneously and quickly process multiple wafers acting as rigid supports of electronic devices having a plastic substrate.

Another advantage relates to the simply and economic manufacturing process being implemented and to the possibility of re-using the carrier, thus reducing the fabrication costs.

Moreover, the process is not invasive for the electronic devices having a flexible substrate so obtained.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
providing a metallic layer on a carrier;
providing a plastic substrate on said metallic layer, the metallic layer temporarily bonding the plastic substrate to the carrier;
forming an electronic device on said plastic substrate; and
releasing said carrier from said plastic substrate, said releasing including breaking bonds between said plastic substrate and said metallic layer using an oxygenated water solution, wherein said releasing includes:
the metallic layer acting as a catalyst in a dismutation reaction that produces gaseous oxygen from the oxygenated water solution; and
using the gaseous oxygen to break bonds between a plastic material of the plastic substrate and the metallic layer.

2. A method according to claim 1, wherein said solution includes hydrogen peroxide.

3. A method according to claim 1, wherein forming the plastic substrate on the metallic layer comprises:
spin coating a liquid plastic precursor on said carrier; and
curing said plastic precursor.

4. A method according to claim 1, wherein said oxygenated water solution is at room temperature.

5. A method according to claim 1, wherein said oxygenated water solution is a solution of hydrogen peroxide in the range of 10-50%.

6. A method according to claim 1, wherein releasing said carrier includes immersing the carrier, plastic substrate, and device in the oxygenated water for a few minutes.

7. A method according to claim 1, further comprising forming a protective tape on said electronic device, wherein releasing said carrier comprise immersing the electronic device in the oxygenated water solution while the protective tape is on said electronic device.

8. A method according to claim 1, wherein said carrier is a semiconductor wafer.

9. A method according to claim 1, wherein said metallic layer includes at least one of Platinum and Palladium.

10. A method according to claim 1, wherein the metallic layer is a double layer comprising an adhesion promoter including at least one of Ti and TiN.

11. A method according to claim 1, wherein said metallic layer has a thickness of 50-150nm.

12. A method, comprising:
providing a metallic layer on a carrier;
forming a plastic layer directly on, and in contact with, said metallic layer, the metallic layer temporarily bonding directly to the plastic layer;
forming an electronic device on said plastic layer; and
releasing said carrier from said plastic layer, said releasing including breaking bonds between said plastic layer and said metallic layer using an oxygenated water solution.

13. A method according to claim 12, wherein releasing said carrier includes immersing the carrier, plastic substrate, and device in the oxygenated water for a few minutes.

14. A method according to claim 12, wherein said carrier is a semiconductor wafer.

15. A method according to claim 12, wherein forming the plastic layer directly on, and in contact with, the metallic layer comprises:
spin coating a liquid plastic precursor on said carrier; and
curing said plastic precursor.

16. A method according to claim 12, wherein said oxygenated water solution is a solution of hydrogen peroxide in the range of 10-50%.

17. A method according to claim 12, further comprising forming a protective tape on said electronic device, wherein releasing said carrier comprise immersing the electronic device in the oxygenated water solution while the protective tape is on said electronic device.

18. A method according to claim 12, wherein said metallic layer includes at least one of Platinum and Palladium.

19. A method according to claim 12, wherein the metallic layer is a double layer comprising an adhesion promoter including at least one of Ti and TiN.

20. A method according to claim 12, wherein said releasing includes:
the metallic layer acting as a catalyst in a dismutation reaction that produces gaseous oxygen from the oxygenated water solution; and
using the gaseous oxygen to break bonds between a plastic material of the plastic layer and the metallic layer.

* * * * *